United States Patent
Broutin et al.

(10) Patent No.: US 10,331,530 B2
(45) Date of Patent: Jun. 25, 2019

(54) DATA PROTECTION FOR MEMORY WITH BUILT-IN SELF-TEST

(71) Applicant: STMicroelectronics (Alps) SAS, Grenoble (FR)

(72) Inventors: Mickael Broutin, Seyssinet Pariset (FR); Benoit Lelievre, Biviers (FR); Nicolas Anquet, Grenoble (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 153 days.

(21) Appl. No.: 15/253,002

(22) Filed: Aug. 31, 2016

(65) Prior Publication Data
US 2017/0220443 A1    Aug. 3, 2017

(30) Foreign Application Priority Data

Feb. 3, 2016   (FR) ..................................... 16 50856

(51) Int. Cl.
| | |
|---|---|
| *G06F 11/00* | (2006.01) |
| *G06F 11/27* | (2006.01) |
| *G06F 11/07* | (2006.01) |
| *G11C 7/24* | (2006.01) |
| *G11C 29/12* | (2006.01) |
| *G11C 29/36* | (2006.01) |

(52) U.S. Cl.
CPC .......... *G06F 11/27* (2013.01); *G06F 11/0778* (2013.01); *G11C 7/24* (2013.01); *G11C 29/12* (2013.01); *G11C 2029/3602* (2013.01)

(58) Field of Classification Search
CPC .............................. G06F 11/27; G06F 11/0778
USPC ....................................................... 714/38.11
See application file for complete search history.

(56) References Cited

U.S. PATENT DOCUMENTS

| | | | |
|---|---|---|---|
| 2005/0246602 A1* | 11/2005 | Bahl ..................... | G11C 29/006 714/733 |
| 2006/0195723 A1 | 8/2006 | Bancel et al. | |
| 2007/0226795 A1* | 9/2007 | Conti ..................... | G06F 21/554 726/22 |
| 2008/0320191 A1* | 12/2008 | Bravo ................. | G06F 13/1684 710/107 |
| 2009/0193302 A1* | 7/2009 | Bingo .................... | G11C 29/40 714/718 |
| 2010/0091537 A1* | 4/2010 | Best ......................... | G11C 5/02 365/51 |

(Continued)

OTHER PUBLICATIONS

Wikipedia "microprocessor" page, retrieved from https://en.wikipedia.org/wiki/Microprocessor on Oct. 29, 2018 (Year: 2018).*

(Continued)

*Primary Examiner* — Yair Leibovich
(74) *Attorney, Agent, or Firm* — Seed IP Law Group LLP (57) ABSTRACT

Embodiments of the circuits described include a method wherein at least one command signal is activated. The activation of the at least one command signal causes a request to a testing circuit of a memory array to enter a memory test mode. The requested memory test mode permits at least part of the memory array to be read. In response to activation of the at least one command signal, a test control circuit initiates an overwrite sequence to overwrite the data stored in the memory array. The test control circuit enables the memory test mode once the overwrite sequence has been completed.

21 Claims, 4 Drawing Sheets

(56) References Cited

U.S. PATENT DOCUMENTS

2010/0091595 A1* 4/2010 Fekih-Romdhane ........................
G11C 29/028
365/201
2011/0185110 A1* 7/2011 Smigelski ............... G06F 21/79
711/103
2017/0357829 A1* 12/2017 Park ......................... H03K 5/24

OTHER PUBLICATIONS

Search Report for FR 1650856, dated Nov. 2, 2016 (2 pages).

* cited by examiner

DATA PROTECTION FOR MEMORY WITH BUILT-IN SELF-TEST

This application claims the priority benefit of French patent application number 16/50856, filed on Feb. 3, 2016.

BACKGROUND

Technical Field

The present disclosure relates to a circuit and method for protecting data stored in a memory, and in particular to a circuit and method of data protection for memories having built-in self-test (BIST) circuits.

Description of the Related Art

Random access memories such as SRAMs (static random access memory) and DRAMs (dynamic RAM) generally comprise testing circuits, such as BIST (built in self test) circuits, allowing testing of the memory cells forming the arrays. For example, the test sequences made available by the BIST circuits may include sequences in which test data is written to and then read from certain portions of the memory array.

For some applications, memories may be employed to store sensitive data, which should not be accessible to unauthorized devices. For example, the sensitive data may include cryptographic keys, passwords, or financial or medical data. The BIST circuit of a memory may provide an entry point for an attacker to gain access to the sensitive data. Indeed, the BIST circuit will generally allow test sequences to be performed, and among the available test sequences, some may allow the contents of the memory to be read out, for example as a memory dump. Therefore, to protect sensitive data, the BIST circuit may be partially or entirely deactivated after testing has been completed at the end of the manufacturing process, such that the contents of the memory can no longer be read using a BIST test sequence. For example, BIST circuits may be deactivated using a one-time programmable fuse.

However, for some memories, it may be desirable to permit testing during their lifetime. For example, if during its lifetime a memory starts to malfunction, testing can be used to identify the source of the malfunction. Such a diagnosis may permit the memory to be repaired, or the circuit design to be improved for future products.

There is thus a need in the art for a solution permitting test functions to be applied to a memory without allowing sensitive data to be obtained by unauthorized parties.

The subject matter discussed in the Background section is not necessarily prior art and should not be assumed to be prior art merely as a result of its discussion in the Background section. Along these lines, the recognition of one or more problems in the prior art discussed in the Background section and the subject matter associated therewith should not be treated as prior art unless expressly stated to be prior art. Instead, the discussion in the Background section encompassing one or more recognized problems in the prior art should be treated as part of the inventor's approach to the particular problem, which in and of itself may also be inventive.

BRIEF SUMMARY

It is an aim of embodiments of the present disclosure to at least partially address one or more needs in the prior art.

According to one aspect, there is provided a method comprising: in response to activation of at least one command signal requesting that a testing circuit of a memory array enters a memory test mode that permits at least part of the memory array to be read, initiating by a test control circuit an overwrite sequence to overwrite the data stored in the memory array; and enabling, by the test control circuit, the memory test mode once the overwrite sequence has been completed.

According to one embodiment, the memory test mode is a bitmap mode permitting a dump of the data stored by the memory array.

According to one embodiment, the overwrite sequence is performed by the testing circuit.

According to one embodiment, the method further comprises verifying, by the test control circuit, that the overwrite sequence has been completed based on a status signal generated by the testing circuit.

According to one embodiment, the memory array is a programmable memory array.

According to one embodiment, the method further comprises: determining, by the test control circuit in response to activation of at least one further command signal requesting that a further memory test mode is entered, whether the overwrite sequence has already been applied to the memory array; and if it is determined that the overwrite sequence has already been applied, enabling the further memory test mode without applying again the overwrite sequence to the memory array.

According to a further aspect, there is provided a test control circuit adapted to: initiate an overwrite sequence to overwrite data stored in a memory array in response to activation of at least one command signal requesting that a memory test mode is entered by a testing circuit of the memory array, the memory test mode permitting at least part of the memory array to be read; and enable the memory test mode once the overwrite sequence has been completed.

According to one embodiment, the test control circuit is further adapted: to determine, in response to activation of at least one further command signal requesting that a further memory test mode is entered, whether the overwrite sequence has already been applied to the memory array; and if it is determined that the overwrite sequence has already been applied, to enable the further memory test mode without applying again the overwrite sequence to the memory array.

According to one embodiment, the memory test mode is a bitmap mode permitting a dump of the data stored by the memory array.

According to a further aspect, there is provided a secure memory comprising: the above test control circuit; and the testing circuit adapted to implement the overwrite sequence.

According to one embodiment, the test control circuit is further configured to verify that the overwrite sequence has been completed based on a status signal generated by the testing circuit.

According to one embodiment, the memory array is a programmable memory array.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. One or more embodiments are described hereinafter with reference to the accompanying drawings. The foregoing and other features and advantages will become apparent from the following detailed description of embodiments, given by way of illustration and not limitation with reference to the accompanying drawings, in which.

DETAILED DESCRIPTION

The term "couple" or "coupled" is used herein to designate an electrical connection between two components which may be a direct connection, or a connection via one or more intermediate components such as capacitors, buffers, etc.

Figure 1:
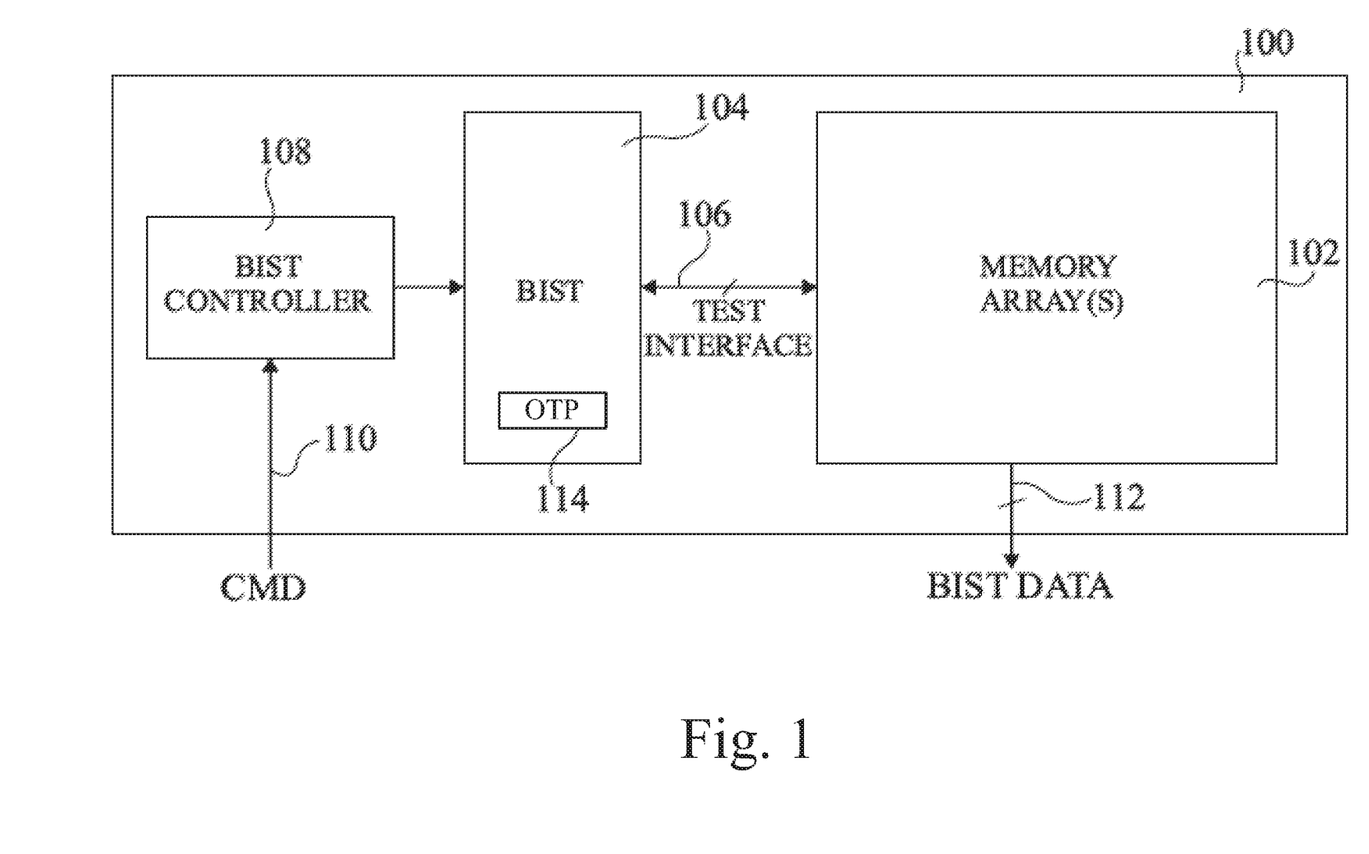
FIG. 1 schematically illustrates a memory circuit having a testing circuit according to an example embodiment.

FIG. 1 schematically illustrates a memory circuit 100 including a testing circuit provided by built-in self-test circuits. As illustrated, the memory circuit 100 comprises one or more memory arrays (MEMORY ARRAY(S)) 102, which are for example SRAM (Static Random Access Memory), DRAM (Dynamic RAM), FLASH memory, EEPROM (electrically erasable programmable read-only memory), Flash EEPROM, or other types of on-chip or off-chip programmable memory arrays.

In addition to its normal input and output connections, the memory arrays 102 are for example coupled to a testing circuit (BIST) 104 via a test interface 106, which for example comprises data and address lines. While the testing circuit 104 is illustrated separately from the memory arrays 102, it will be apparent to those skilled in the art that in practice the testing circuit 104 can be integrated with the memory arrays 102. The testing circuit 104 is for example controlled by a test control circuit (BIST CONTROLLER) 108, which for example selects one of a plurality of available test modes to be entered by the testing circuit 104 and in some cases supplies test data. The test control circuit 108 for example receives a control signal CMD on one or more input lines 110 indicating a test mode to be entered. In some test modes, test output data (BIST DATA) is provided on output lines 112 of the memory arrays 102.

Test modes permitting data to be read out or "dumped" from the memory arrays 102 are problematic when the memory arrays store sensitive data, as they could be used by attackers to gain unauthorized access to the sensitive data. There are the following potential solutions for avoiding such a security breach, each with corresponding drawbacks:

the testing circuit 104 could be configured to only support test modes that do not permit memory read or dump operations. However, such a strategy would slow down or make it impossible to perform reliability analysis in case of design process issues. Furthermore, return analysis and diagnostics during the lifetime of the memory would be slow or impossible;

the testing circuit 104 could be designed with one or more one-time programmable fuses 114, permitting test modes that allow memory read or dump operations to be permanently disabled at a specific time following fabrication, for example once testing has been completed and before the memory leaves the fabrication plant. However, this solution would still lead to slow or impossible return analysis and diagnostics during the lifetime of the memory;

the testing circuit 104 could include cryptographic circuits for enabling and disabling test modes that allow memory read or dump operations. However, such cryptographic circuits, which for example require the use of a secret key, would add complexity and cost. For example, external ATE test equipment would have to supply the secret key to the device under test (DUT).

Figure 2:
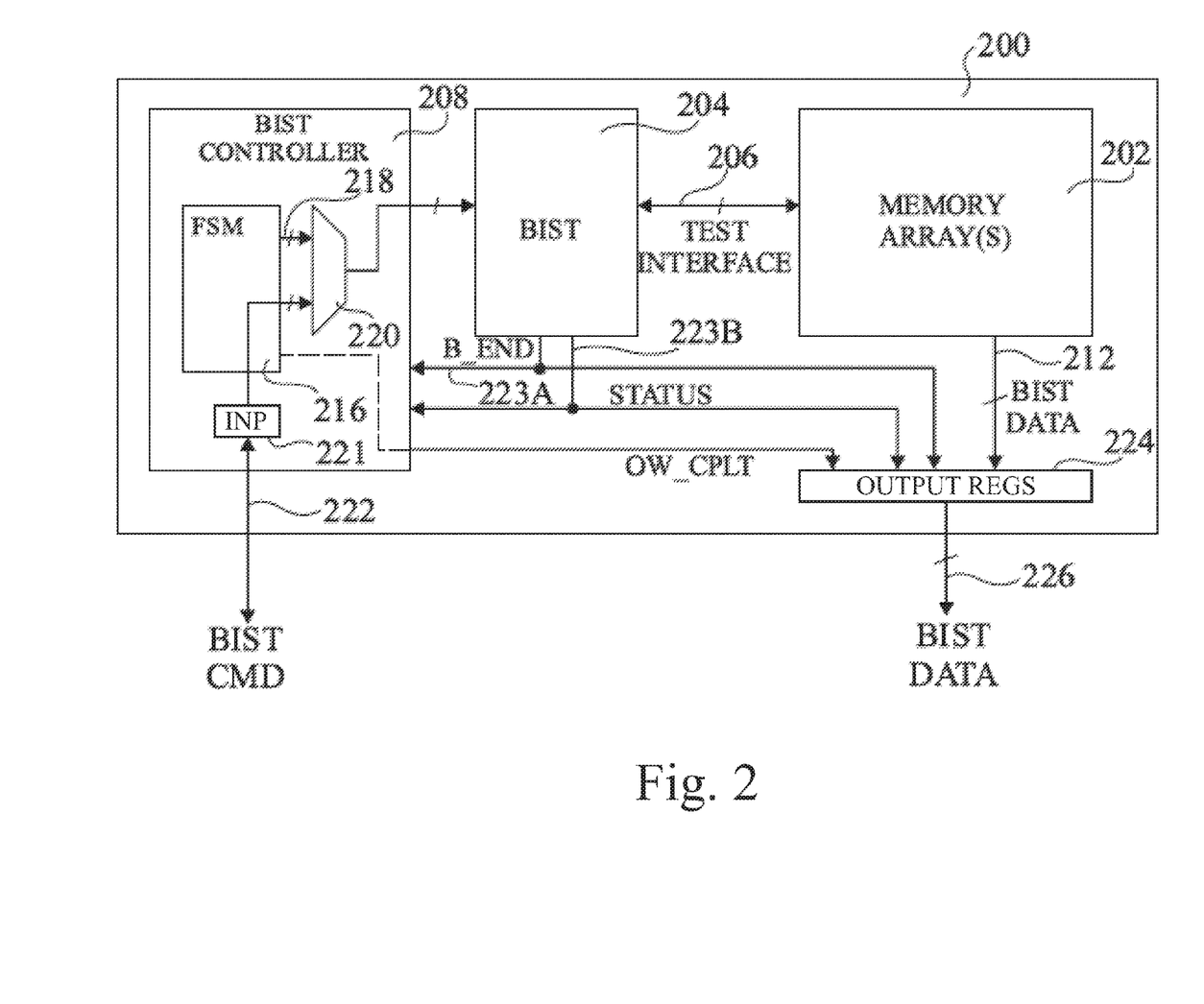
FIG. 2 schematically illustrates a memory circuit having a testing circuit according to an example embodiment of the present disclosure.

FIG. 2 schematically illustrates a memory circuit according to an example embodiment of the present disclosure.

As illustrated, the memory circuit 200 for example comprises one or more memory arrays (MEMORY ARRAY(S)) 202, which are for example SRAM, DRAM, FLASH memory, EEPROM (electrically erasable programmable read-only memory), Flash EEPROM, or other types of on-chip or off-chip programmable memory arrays. In view of the sensitive data to be stored by these memory arrays 202, they are for example secure circuits, having some form of protection against tampering. For example, the data arrays are rendered secure by scrambling the data they hold using a secret key. Furthermore, in some embodiments the memory arrays may embed a field detector capable of detecting an external attack such as a laser or EMP (electromagnetic pulse) attack and, in response to the detection of such an attack, of corrupting the data held by the memory arrays.

The memory arrays 202 are coupled to a testing circuit (BIST) 204 via a test interface 206, which for example comprises data and address lines. While the testing circuit 204 is illustrated separately from the memory arrays 202, it will be apparent to those skilled in the art that in practice the testing circuit 204 can be integrated with the memory arrays 202. The testing circuit 204 is for example controlled by a test control circuit (BIST CONTROLLER) 208, which for example selects one of a plurality of available test modes to be entered by the testing circuit 204 and in some cases supplies test data to the testing circuit 204. For example, one of the test modes supported by the test circuit 204 is a bitmap mode. A bitmap mode involves outputting all or some of the data stored by the memory arrays 202. The memory arrays 202 for example comprise output lines 212 providing the data (BIST DATA) read from the memory arrays 202 during such a test mode.

The test control circuit 208 is for example capable of performing an overwrite operation to overwrite some or all of the data stored in the memory arrays 202 before allowing the testing circuit 204 to enter certain vulnerable test modes, such as the bitmap mode. For this, the test control circuit 208 for example comprises a finite state machine (FSM) 216, which is adapted to trigger the writing of fill values to the memory arrays 202. In some embodiments, the FSM 216 generates the fill values and for example provides them on output lines 218 to the testing circuit 204 via a multiplexer 220. The testing circuit 204 then initiates a write sequence to write the fill values to the memory arrays 202. Alternatively, the testing circuit 204 may store or be capable of generating the fill values, and the FSM 216 generates one or more control signals on the output lines 218 to the testing circuit 204 to initiate the overwrite sequence to cause the testing circuit 204 to overwrite the data in the memory arrays 202.

In some embodiments, the fill values cause a checker board pattern to be written to the memory arrays 202, although in alternative embodiments, the memory arrays 202 could be filled with different data.

The multiplexer 220 also for example receives test control and/or test data signals (BIST CMD) via an input register 221 coupled to one or more input lines 222 of the test control circuit 208. These test control or data signals are for example supplied to the memory circuit 200 via a test access port (TAP) (not illustrated in FIG. 2) coupled to the one or more input lines 222. The multiplexer 220 is for example controlled by the FSM 216, which decides, based on the particular command signal BIST CMD, whether to grant access to the memory arrays directly by selecting the input from the input register 221 to be provided to the testing circuit, or whether to initiate the fill sequence by selecting the signals on the lines 218 from the FSM 218 to be coupled to the testing circuit 204 until the overwrite sequence has been completed.

For example, the testing circuit 204 implements the overwrite sequence via the test interface 206 with the memory arrays 202, and activates a process end signal B_END on a line 223A when the process has ended. The test interface 206 also for example generates a status signal STATUS on an output line 223B when the overwrite sequence is complete. The lines 223A and 223B are for example coupled to one or more output registers 224 of the memory arrays 202. The registers 224 are for example coupled to the output lines 212 of the memory arrays 202 for receiving the data (BIST DATA) read from the memory arrays 202. The lines 223A and 223B are also for example provided to the test control circuit 208, and based on these signals, the FSM 218 for example generates a signal OW_C-PLT indicating when the overwrite sequence has been successfully completed. This signal OW_CPLT is also for example provided to the registers 224.

When the overwrite sequence has been successfully completed, the test control circuit 208 permits the testing circuit 204 to enter the requested test mode, for example the bitmap mode, by controlling the multiplexer 220 to provide the command signals and/or test data from the register 221 to the testing circuit 204. Furthermore, the control circuit 208, and in particular the FSM 216, for example enables, via the signal OW_CPLT, the register 224 to provide the data BIST DATA, read from the memory arrays 202, on output lines 226 of the memory circuit 200.

Operation of the circuit of FIG. 2 will now be described in more detail with reference to FIG. 3.

Figure 3:
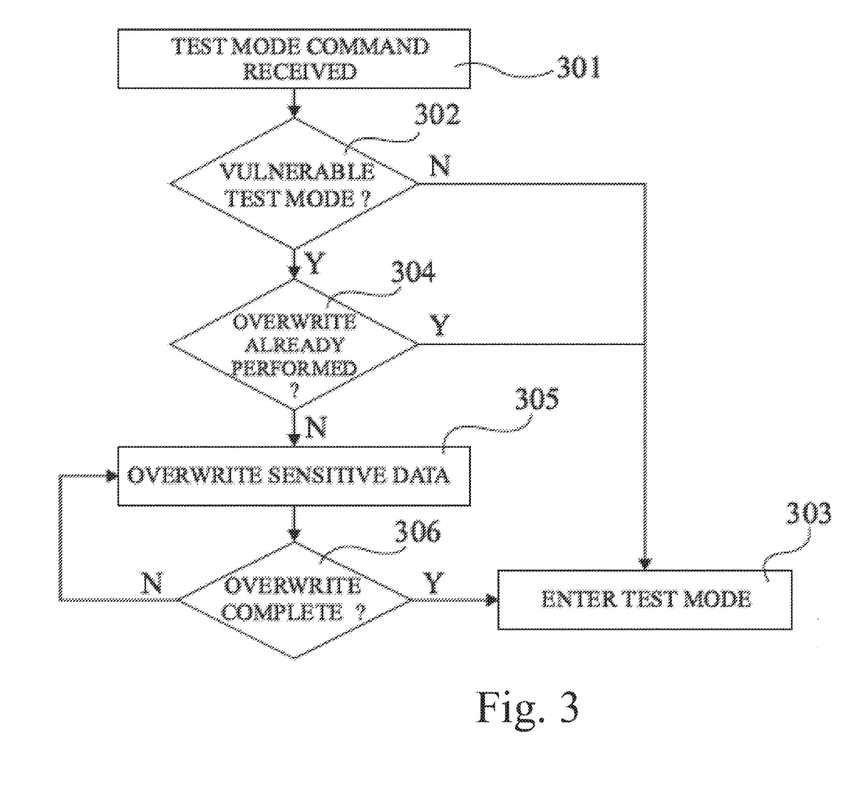
FIG. 3 is a flow diagram illustrating steps in a method of testing a memory circuit according to an example embodiment of the present disclosure.

FIG. 3 is a flow diagram illustrating operations in a method of testing a memory circuit according to an example embodiment.

Initially, it is assumed that the memory circuit 200 is to be tested, and that a design initialization sequence of the BIST test and control circuits 204, 208 has been performed, involving for example clock initialization, power initialization, memory initialization, etc.

In an initial operation 301, a test mode command is received.

An operation 302 then involves detecting, for example by the FSM 216, whether or not the requested test mode is a vulnerable test mode. For example, the FSM 216 detects when the instruction code of the test mode command indicates that a bitmap mode is to be entered, or another test mode in which data from a memory array can be read or dumped. If the test mode is not a vulnerable test mode, the next operation is for example an operation 303, in which the requested test mode is entered directly. Otherwise, if the test mode is a vulnerable test mode, the next operation is 304.

In operation 304, it is for example determined whether or not an overwrite of the memory arrays has already been performed since the last time sensitive data was held in the memories. For example, the test control circuit 208 has a register storing one or more bits of data indicating when an overwrite sequence has been applied to the memory arrays, and this register is for example reset when normal operation of the memory arrays resumes. If the memory arrays have already been overwritten, the method for example goes directly to operation 303. In this way, one or more vulnerable test modes can be entered one after the other, and it is not necessary to perform an overwrite sequence each time. If an overwrite has not yet been performed, the next operation is 305.

In operation 305, the data stored by the memory arrays 202, including any sensitive data, is overwritten, for example under the control of the test control circuit 208. In particular, as indicated above, the FSM 216 or testing circuit 204 is for example used to generate fill values to be written to the memory array 202, and the overwrite sequence is performed for a sufficient number of memory cycles to overwrite all memory locations in the memory arrays 202. For example, each fill value is a data word for overwriting a row in one of the memory arrays 202, and the testing circuit 204 comprises a row driver for addressing each of the rows of the memory arrays in turn in order to overwrite their contents, although the particular overwrite method will depend on the particular type of memory being used.

As mentioned above, in one example, the fill data is a checker board pattern, in which the memory cells are alternately programmed with logic 0's and logic 1's, such that adjacent memory cells of each memory array are programmed with opposite logic states. Of course, other patterns could be used for the fill values.

In a subsequent operation 306, it is determined by the test control circuit 208 whether the overwrite sequence is complete. For example, the status signal STATUS on the output line 223B of the testing circuit 204 is used as an indication of whether each row of each memory array 202 has been overwritten. Operation 306 is for example repeated until the overwrite sequence is complete. Once complete, the next operation is for example the operation 303, in which the requested vulnerable test mode is entered, and any corresponding test operation involving a memory accesses can be permitted. For example, this operation involves controlling, by the FSM 216, the multiplexer 220 to couple the test command signals and/or test data from the input register 221 to the testing circuit 204, and enabling the output data at the register 224.

Figure 4:
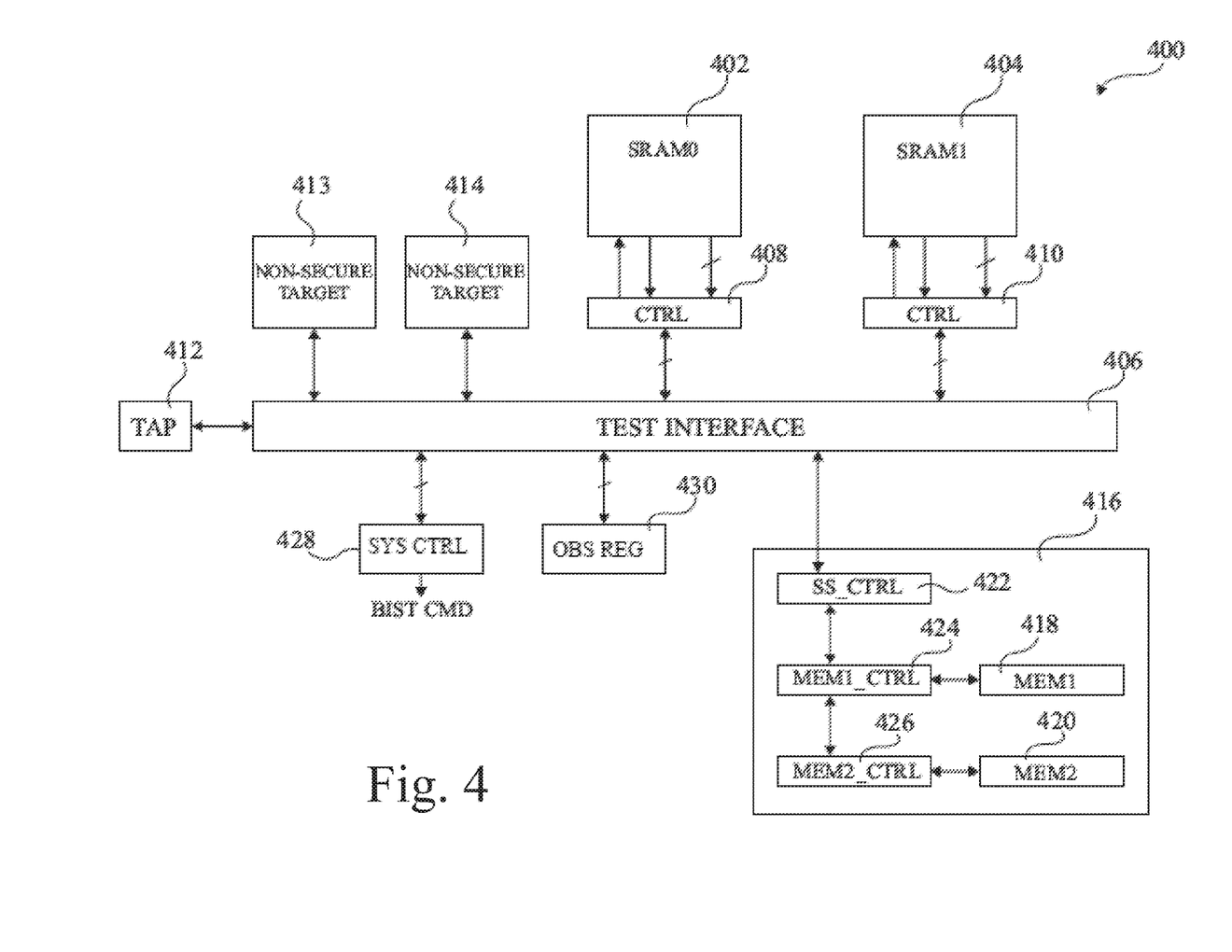
FIG. 4 schematically illustrates a system comprising secure memory devices according to an example embodiment.

FIG. 4 schematically illustrates a system 400, which is for example a system on chip (SoC). The system 400 for example comprises a plurality of secure memory arrays (SRAM0, SRAM1) 402, 404. The memory array 402 is for example coupled to a test interface (TEST INTERFACE) 406 via test circuitry (CTRL) 408, and the memory array 404 is for example coupled to the test interface 406 via test circuitry (CTRL) 410. The test circuitry 408, 410 each for example comprises the testing circuit 204 and test control circuit 208 of FIG. 2. The test interface 406 is for example coupled to a test access port (TAP) 412, permitting communications off-chip. Furthermore, in some embodiments the test interface 406 may be coupled to non-secure targets 413, 414, which are for example memory arrays for which any test mode can be entered without an overwrite operation.

Furthermore, the test interface 406 may be coupled to a sub-system 416 of the system 400, which for example comprises memory arrays (MEM1) 418 and (MEM2) 420, a control circuit (SS_CTRL) 422, and test circuitry (MEM1_CTRL, MEM2_CTRL) 424, 426 respectively coupled to the memories 418, 420, and to the control circuit 422. The test circuitry 424, 426 each for example comprise the testing circuit 204 and test control circuit 208 of FIG. 2.

The test interface 406 is also for example coupled to a system control circuit 428, which is for example adapted to generate an appropriate command signal BIST CMD in order to request the bitmap test mode or other vulnerable test mode. For example, a request is received via the TAP 412 for the bitmap mode to be entered and the system control circuit 428 receives this request and generates in response an appropriate command signal. An observation register 430 is for example provided for implementing the output register 224 of the test circuitry of each memory circuit.

An advantage of embodiments described herein is that sensitive data in a memory circuit can be protected from unauthorized access via a test interface in a simple manner without requiring a cryptographic protection mechanism, and while still permitting test modes that include memory dump functions.

Having thus described at least one illustrative embodiment, various alterations, modifications and improvements will readily occur to those skilled in the art. For example, it will be apparent to those skilled in the art that, while embodiments have been described in which it is a testing circuit that performs the overwrite of the data in each memory array, in alternative embodiments, the overwrite sequence could be implemented by other circuitry. Furthermore, the use of the finite state machine 216 of FIG. 2 is merely one example, and in alternative embodiments other implementations would be possible.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
activating at least one command signal wherein the command signal is arranged to request a testing circuit of a memory array to enter a memory test mode, wherein the requested memory test mode permits at least part of the memory array to be read;
in response to activating the at least one command signal, determining whether the memory test mode is a vulnerable test mode;
in response to determining that the memory test mode is a vulnerable test mode, determining whether or not an overwrite was already performed;
in response to determining that the memory test mode is the vulnerable test mode and determining that the overwrite was not already performed, initiating, by a test control circuit, an overwrite sequence to overwrite sensitive data stored in the memory array; and
enabling, by the test control circuit, the memory test mode after the overwrite sequence has been completed.

2. The method of claim 1, wherein the memory test mode is a bitmap mode permitting a dump of data stored in the memory array.

3. The method of claim 1, wherein the overwrite sequence is performed by the testing circuit.

4. The method of claim 3, further comprising:
verifying, by the test control circuit, that the overwrite sequence has been completed based on a status signal generated by the testing circuit.

5. The method of claim 1, wherein the memory array is a programmable memory array.

6. The method of claim 1, further comprising:
determining, by the test control circuit in response to activation of at least one further command signal requesting that a further memory test mode is entered, whether the overwrite sequence has already been applied to the memory array; and
in response to determining that the overwrite sequence has already been applied, enabling the further memory test mode without applying again the overwrite sequence to the memory array.

7. The method of claim 1, wherein the overwrite sequence includes writing data in the memory array in a predetermined pattern.

8. The method of claim 1, wherein the overwrite sequence includes writing test data in the memory array received from an outside source.

9. The method of claim 1, wherein the overwrite sequence includes writing test data in the memory array generated by the testing circuit or the test control circuit.

10. The method of claim 1, further comprising:
asserting an overwrite complete status signal after the overwrite sequence has been completed.

11. The method of claim 1, further comprising:
in response to enabling the memory test mode, performing at least one memory test by the testing circuit.

12. An apparatus, comprising:
a test control circuit, the test control circuit arranged for coupling to a testing circuit and further arranged for coupling to a memory array, the test control circuit adapted to:
activate a command signal that requests the testing circuit enter one of the plurality of memory test modes, the one of the plurality of memory test modes permitting at least part, of the memory array to be read;
determine whether the requested one of the plurality of memory test modes is a vulnerable test mode;
determine whether or not, an overwrite of data in the memory array was already performed;
initiate an overwrite sequence to overwrite sensitive data stored in the memory array in response to: 1) activation of the command signal, 2) a determination that the memory test mode is the vulnerable test mode, and 3) a determination that the overwrite of data in the memory array was not already performed: and
enable the memory test mode after the overwrite sequence has been completed.

13. The apparatus of claim 12, wherein the test control circuit is further adapted:
to determine, in response to activation of at least one further command signal requesting that a further memory test mode is entered, whether the overwrite sequence has already been applied to the memory array; and
in response to a determination that the overwrite sequence has already been applied, to enable the further memory test mode without applying again the overwrite sequence to the memory array.

14. The apparatus of claim 12, wherein the memory test mode is a bitmap mode permitting a dump of the data stored by the memory array.

15. The apparatus of claim 12, wherein the overwrite sequence includes writing data in the memory array in a pattern.

16. The apparatus of claim 12, wherein the overwrite sequence includes receiving test data from an outside source and writing the test data in the memory array.

17. A secure memory device, comprising:

a memory array;

a testing circuit, the testing circuit adapted to implement an overwrite sequence and a plurality of test modes; and a test control circuit adapted to:

- activate a command signal that requests the testing circuit enter one of the plurality of memory test modes, the one of the plurality of memory test modes permitting at least part of the memory array to be read:
- form a first determination that the requested one of the plurality of memory test modes is a vulnerable test mode:
- form a second determination that an overwrite of data in the memory array has not been performed:
- initiate the overwrite sequence to overwrite sensitive data stored in the memory array in response to activation of the command signal formation of the first determination, and formation of the second determination: and
- enable entry into the one of the plurality of memory test modes after the overwrite sequence has been completed.

18. The secure memory device of claim 17, wherein the test control circuit is further configured to verify that the overwrite sequence has been completed based on a status signal generated by the testing circuit.

19. The secure memory device of claim 16, wherein the memory array is a programmable memory array.

20. The secure memory device of claim 17, wherein the test control circuit is further adapted:

- to determine whether the overwrite sequence has already been applied to the memory array after activation of a second command signal requesting entry into a second one of the plurality of memory test modes; and
- in response to a determination that the overwrite sequence has already been applied, to enable the second one of the plurality of memory test modes without re-applying the overwrite sequence to the memory array.

21. The secure memory device of claim 17, wherein the overwrite sequence includes writing data in the memory array in a pattern.

\* \* \* \* \*